United States Patent
Looi et al.

(10) Patent No.: US 9,003,644 B2
(45) Date of Patent: Apr. 14, 2015

(54) PNP APPARATUS AND PNP TOOL HEAD WITH DIRECT BONDING PRESSURE PICK-UP TIP

(71) Applicant: STMicroelectronics Asia Pacific Pte Ltd (Singapore), Singapore (SG)

(72) Inventors: Hk Looi, Singapore (SG); Cheng-hai Cheh, Singapore (SG); HaiKin Toh, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 109 days.

(21) Appl. No.: 13/651,562

(22) Filed: Oct. 15, 2012

(65) Prior Publication Data

US 2014/0105717 A1    Apr. 17, 2014

(51) Int. Cl.
  *H05K 3/30*    (2006.01)
  *B25J 15/06*   (2006.01)
  *H05K 13/04*   (2006.01)

(52) U.S. Cl.
  CPC ............ *B25J 15/0616* (2013.01); *Y10S 901/40* (2013.01); *H05K 13/0404* (2013.01); *H05K 13/0408* (2013.01)

(58) Field of Classification Search
  CPC . H01L 21/6838; B65G 47/91; H05K 13/0408
  USPC ................... 29/740–743, 832–834, DIG. 44; 294/64.2–64.3, 185–188, 65, 87.1; 414/737, 749.1, 912; 901/16
  See application file for complete search history.

(56) References Cited

U.S. PATENT DOCUMENTS

| | | | |
|---|---|---|---|
| 3,702,698 A * | 11/1972 | Schwebel | 271/103 |
| 4,703,965 A | 11/1987 | Lee et al. | |
| 4,763,941 A * | 8/1988 | Sniderman | 294/186 |
| 4,815,779 A * | 3/1989 | Glessner et al. | 414/752.1 |
| 5,193,776 A * | 3/1993 | Nagai et al. | 188/67 |
| 5,542,168 A | 8/1996 | Best | |
| 5,636,425 A | 6/1997 | Best | |
| 5,664,322 A | 9/1997 | Best | |
| 5,680,694 A | 10/1997 | Best | |
| 6,000,122 A * | 12/1999 | Uchida et al. | 29/740 |
| 6,428,267 B1 | 8/2002 | Terpstra | |
| 6,457,759 B1 * | 10/2002 | Unokuchi | 294/186 |
| 6,695,369 B2 | 2/2004 | Schmidt et al. | |
| 7,261,350 B2 | 8/2007 | Isetani et al. | |
| 7,374,217 B2 * | 5/2008 | Pabst | 294/64.3 |
| 7,605,015 B2 | 10/2009 | Ponza et al. | |
| 7,629,186 B2 | 12/2009 | Siaudeau | |
| 7,675,170 B2 | 3/2010 | Formosa | |
| 7,880,132 B2 | 2/2011 | Brodie et al. | |
| 8,037,918 B2 * | 10/2011 | Wang et al. | 156/538 |

(Continued)

*Primary Examiner* — Minh Trinh
(74) *Attorney, Agent, or Firm* — Allen, Dyer, Doppelt, Milbrath & Gilchrist, P.A.

(57) ABSTRACT

A PNP apparatus may include a robotic arm, and a PNP tool head carried by the robotic arm. The PNP tool head may include a body configured to apply bonding pressure to a first area of an electronic device, and a pick-up tip movable between an extended position and a retracted position relative to the body as the pick-up tip rests against a second area of the electronic device. The pick-up tip may define a vacuum passageway therethrough to couple a vacuum source to the second area of the electronic device.

17 Claims, 3 Drawing Sheets

(56) References Cited

U.S. PATENT DOCUMENTS

| | | |
|---|---|---|
| 8,210,586 B2 | 7/2012 | Hawes |
| 8,360,274 B2 * | 1/2013 | Shen et al. .................... 221/211 |
| 8,430,439 B2 * | 4/2013 | Tsai et al. .................... 294/64.3 |
| 2005/0200142 A1 | 9/2005 | Isetani et al. |
| 2008/0000756 A1 | 1/2008 | Behnke et al. |
| 2008/0148557 A1 | 6/2008 | Jonke et al. |
| 2008/0315603 A1 | 12/2008 | Rachkov |
| 2009/0057544 A1 | 3/2009 | Brodie et al. |
| 2009/0145545 A1 | 6/2009 | Brennan et al. |
| 2010/0315622 A1 | 12/2010 | Campbell |

* cited by examiner

PNP APPARATUS AND PNP TOOL HEAD WITH DIRECT BONDING PRESSURE PICK-UP TIP

FIELD OF THE INVENTION

The present invention relates to the field of device manufacturing, and, more particularly, to pick-and-place assembly and related methods.

BACKGROUND OF THE INVENTION

Typically, electronic devices include one or more camera modules for providing enhanced media functionality. For example, the typical electronic device may utilize the camera modules for photo capturing and video teleconferencing. In the typical electronic device with multiple camera modules, the primary camera module has a high pixel density and an adjustable focus lens system while the secondary camera module is front-facing and has a lower pixel density. Also, the secondary camera module may have a fixed focus lens system.

For example, U.S. Patent Application No. 2009/0057544 to Brodie et al, assigned to the present application's assignee, discloses a camera module for a mobile device. The camera module comprises a lens, a housing carrying the lens, and a lens cap over the lens and housing. The camera module includes a barrel mechanism for adjusting the lens.

During manufacture of an electronic device including one or more camera modules, there is a desire to manufacture the electronic device as quickly as possible, particularly in mass production runs. Manufacture of the electronic device may be performed manually or via machine. For example, in electronic devices that use surface mounted components, a pick-and-place (PNP) machine may assemble the components onto a printed circuit board (PCB). Quite literally, the PNP comprises a robotic arm that maneuvers and picks a component from one position and installs (i.e. places) the component on the PCB.

The typical PNP machine is a complex device that is quite customizable. Given the size and sensitivity of the components being assembled, the movements of the PNP machine are programmable with great precision. For example, the exact speed of the robotic arm as it travels is controlled. Of course, there is a general desire to increase the speed of the robotic arm, thereby increasing the units per hour (UPH) that the PNP machine can assemble. Barriers to the speed of the robotic arm are not only based upon the mechanical limits of the robotic arm, but also the limits of the components being assembled.

For example, in the typical camera module component, such as the adjustable zoom camera module component discussed above, the barrel is movable and may be damaged due to the acceleration forces during assembly by the typical PNP machine. In particular, camera module components comprising a voice coil motor (VCM) actuator for the barrel are susceptible to damage if the PNP operates at too great a speed.

Referring initially to FIGS. 1-2B, an approach for picking-and-placing a VCM camera device 60 using a PNP device 70 is shown. The VCM camera device 60 illustratively includes a housing 63, and a lens barrel 62 carried by the housing. The housing 63 illustratively includes a plurality of suction areas 61a-61d. The PNP device 70 illustratively includes a robotic arm, and a PNP tool head coupled to the robotic arm and comprising a central passageway 71 coupled to a vacuum source, and a plurality of suction openings 72a-72d coupled to the central passageway. During a typical pick operation, the robotic arm moves the PNP tool head to be adjacent the VCM camera device 60 so that the plurality of suction openings 72a-72d are correspondingly positioned on the plurality of suction areas 61a-61d, thereby creating a suction attachment between the PNP device 70 and VCM the camera device 60. The PNP tool head may then move and place the VCM camera device 60. A drawback to this approach is that the lens barrel 62 is in free motion during the movement of the robotic arm. Accordingly, during applications where the robotic arm moves at high speeds, the lens barrel 62 may damage the VCM motor actuator.

SUMMARY OF THE INVENTION

In view of the foregoing background, it is therefore an object of the present invention to provide a PNP apparatus that is efficient and robust.

This and other objects, features, and advantages in accordance with the present invention are provided by a PNP apparatus that may comprise a robotic arm, and a PNP tool head carried by the robotic arm. The PNP tool head may comprise a body configured to apply bonding pressure to a first area of an electronic device, and a pick-up tip movable between an extended position and a retracted position relative to the body as the pick-up tip rests against a second area of the electronic device. The pick-up tip may define at least one vacuum passageway therethrough to couple a vacuum source to the second area of the electronic device. Advantageously, the VCM actuator of a camera device may be subject to less risk of damage during a PNP operation.

More specifically, the body may have a tip receiving passageway therein, and the pick-up tip may be slidably received within the tip receiving passageway. The PNP apparatus may further comprise a bond head coupled to the robotic arm, and at least one bias member coupled between the bond head and the body.

The bond head may have a recess therein configured to receive the pick-up tip when in the retracted position. The pick-up tip may have a tubular shape with a distal open end defining the at least one vacuum passageway, and a vacuum source port coupled in fluid communication with the distal open end. The vacuum source may be coupled in fluid communication with the PNP tool head. In some embodiments, the PNP apparatus may further comprise a controller coupled to the robotic arm.

For example, the electronic device may have a rectangular shape with four upper corner portions defining the first area. Also, the electronic device may have a rectangular shape with an upper medial portion defining the second area, and the at least one vacuum passageway may comprise a single vacuum passageway aligned with the upper medial portion of the electronic device. The electronic device may comprise an image sensor housing defining the first area, and a lens barrel carried by the image sensor housing defining the second area.

Another aspect is directed to a method of positioning an electronic device with a PNP apparatus comprising a robotic arm, and a PNP tool head carried by the robotic arm comprising a body to apply bonding pressure to a first area of an electronic device, and a pick-up tip to be movable between an extended position and a retracted position relative to the body as the pick-up tip rests against a second area of the electronic device. The pick-up tip may define at least one vacuum passageway therethrough to couple a vacuum source to the second area of the electronic device. The method may comprise engaging the pick-up tip adjacent the second area of the electronic device, and subsequently engaging the body adjacent the first area of the electronic device.

DETAILED DESCRIPTION OF THE PREFERRED EMBODIMENTS

Figure 1:
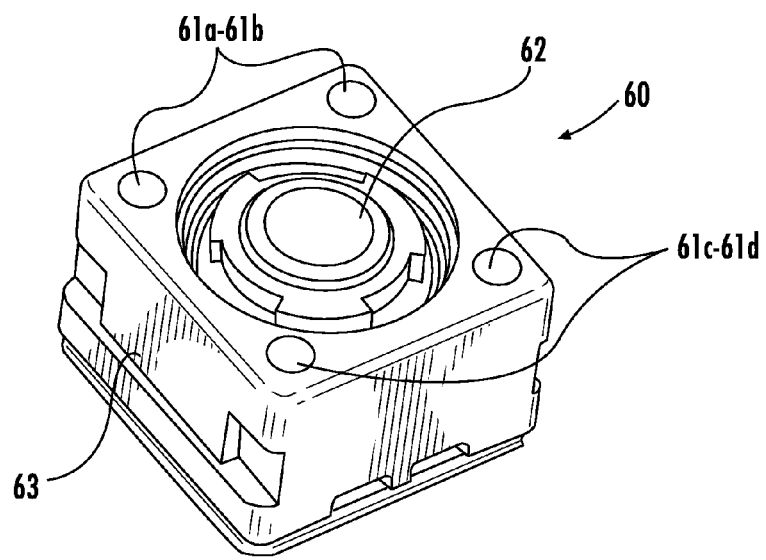
FIG. 1 is a perspective view of an electronic device, according to the prior art.
Figure 2A:
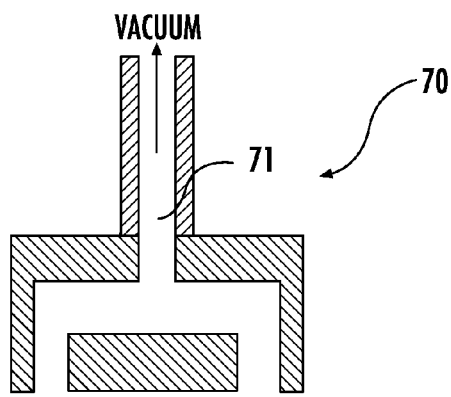
FIG. 2A is a cross-sectional view of a PNP tool head along line 2A, according to the prior art.
Figure 2B:
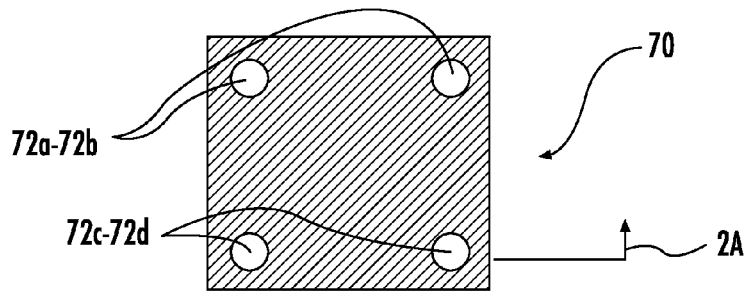
FIG. 2B is a bottom plan view of the PNP tool head of FIG. 2A.
Figure 3:
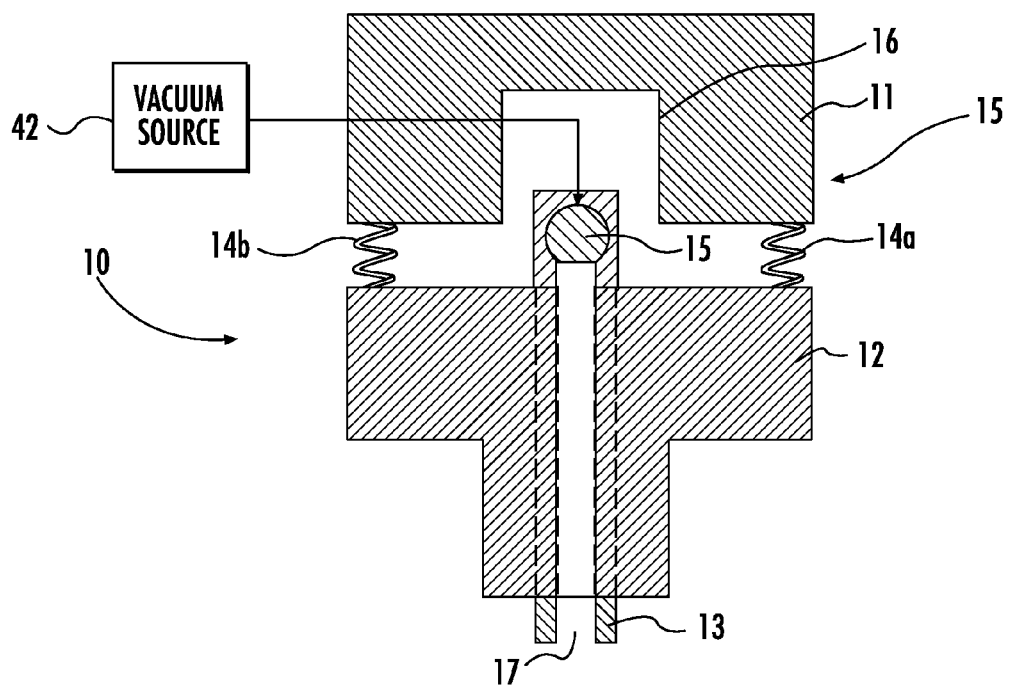
FIG. 3 is a side view of a PNP tool head, according to the present embodiments.
Figure 4:
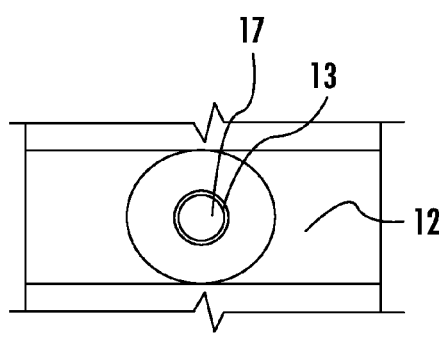
FIG. 4 is a bottom plan view of the PNP tool head from FIG. 3.
Figure 5:
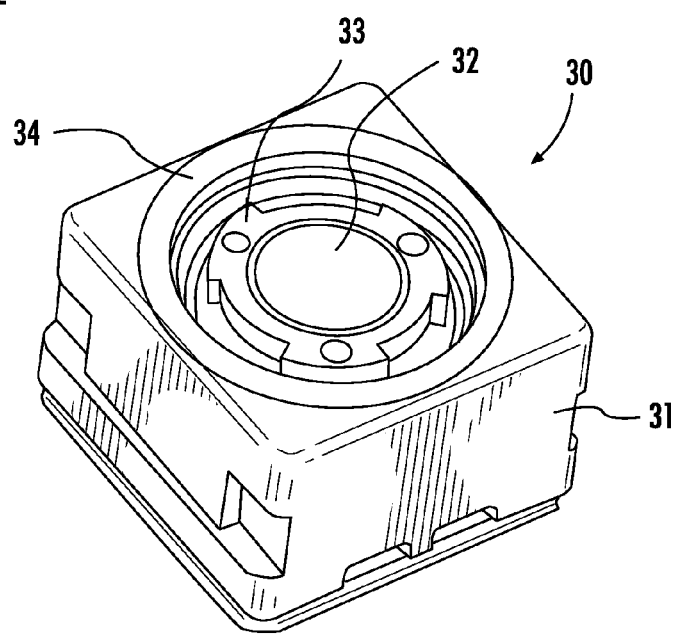
FIG. 5 is a perspective view of an electronic device, according to the present embodiments.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring now to FIGS. 3-6C, a PNP apparatus 10 according to the present embodiments is now described. The PNP apparatus 10 illustratively includes a robotic arm 40 (FIGS. 6A-6B), and a PNP tool head 45 carried by the robotic arm. The PNP tool head 45 illustratively includes a body 12 configured to apply bonding pressure to a first area 34 of an electronic device 30. The PNP tool head 45 illustratively includes a pick-up tip 13 movable between an extended position (FIG. 6A) and a retracted position (FIG. 6C) relative to the body 12 as the pick-up tip rests against a second area 32 of the electronic device 30 (only the weight of the pick-up tip is applied to the second area). The pick-up tip 13 defines a vacuum passageway 17 therethrough to couple a vacuum source 42 to the second area 32 of the electronic device 30.

For example, in the illustrated embodiment, the electronic device 30 has a rectangular shape with four upper corner portions defining the first area 34. Also, the electronic device 30 illustratively has a rectangular shape with an upper medial portion defining the second area 32, and the vacuum passageway 17 comprises a single vacuum passageway aligned with the upper medial portion of the electronic device. The electronic device 30 illustratively comprises an image sensor housing 31 defining the first area 34, and a lens barrel 33 carried by the image sensor housing defining the second area 32. Of course, in other embodiments, the electronic device 30 may comprise other components, such as a microprocessor.

Figure 6C:
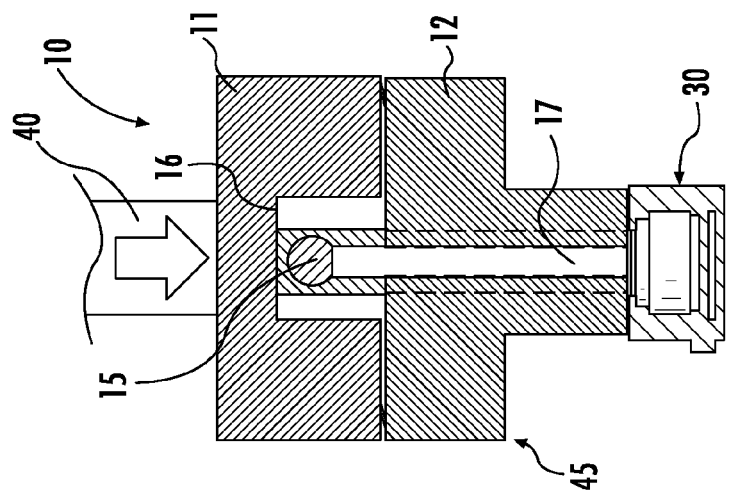
FIGS. 6A-6C are side views of the PNP tool head from FIG. 3 during a PNP operation.
Figure 6B:
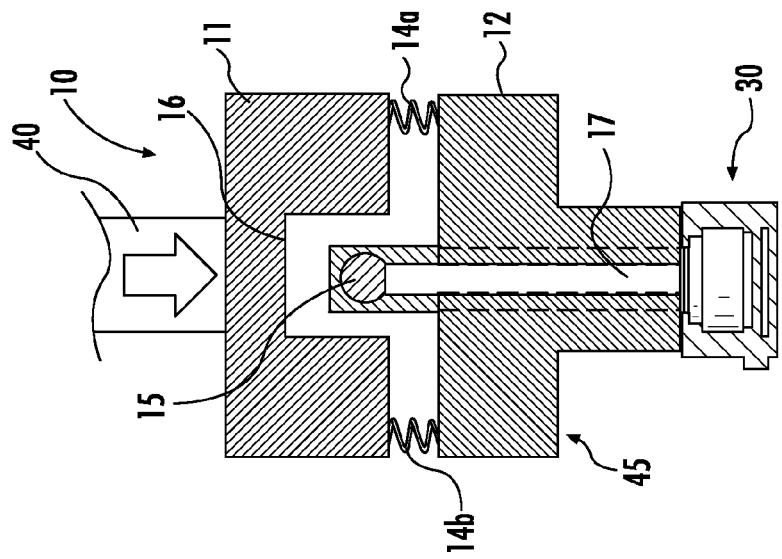
Figure 6A:
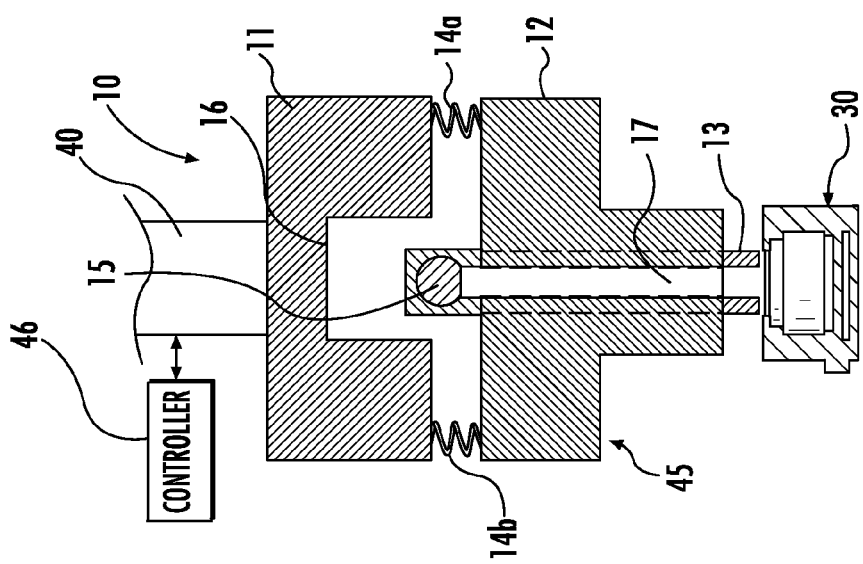

More specifically, the body 12 illustratively includes a tip receiving passageway therein, and the pick-up tip 13 may be slidably received within the tip receiving passageway, as perhaps best seen in FIGS. 6A-6C. The PNP apparatus 10 illustratively includes a bond head 11 coupled to the robotic arm 40, and a plurality of bias members 14a-14b coupled between the bond head 11 and the body 12. For example, the plurality of bias members 14a-14b illustratively comprise springs.

The pick-up tip 13 contacts the electronic device 30 in the extended position and moves within the body 12 before the body applies the bonding pressure to the first area 34 of the electric device 30. The pick-up tip 13 is configured to maintain a position of the lens barrel 33 of the electronic device 30 during movement of the pick-up tip, thereby preventing damage to the lens barrel. Advantageously, the only force applied to lens barrel is from the weight of the electronic device 30.

The bond head 11 illustratively includes a recess 16 therein configured to receive the pick-up tip 13 when in the retracted position (FIG. 6C), the retraction occurring during a bonding operation. The pick-up tip 13 illustratively includes a tubular shape with a distal open end defining the vacuum passageway 17, and a vacuum source port 15 coupled in fluid communication with the distal open end. The PNP apparatus 10 may further comprise a tube (not shown) coupled between the vacuum source 42 and the closed proximal end. The vacuum source 42 is coupled in fluid communication with the PNP tool head 45. In the illustrated embodiment, the PNP apparatus includes a controller 46 (FIG. 6A) coupled to the robotic arm 40.

Advantageously, and as perhaps best seen in FIGS. 6A-6C, during a PNP operation, the robotic arm 40 maneuvers the PNP tool head 45 to be above the electronic device 30. The pick-up tip 13 is in the extended position, and the vacuum source 42 is fluidly coupled thereto. The pick-up tip 13 is positioned to be adjacent the second area 32, i.e. the lens barrel 33, and a suction attachment to the second area is accomplished. The robotic arm 40 may then move the PNP tool head 45 to a second position designated for device placement (i.e. bonding). The robotic arm 40 then provides downward force on the bond head 11 and via the springs 14a-14b, also the body 12. The springs 14a-14b help maintain a gap between the bond head 11 and the body 12, thereby urging the pick-up tip 13 to travel vertically and up into the recess 16 of the bond head, thereby not applying bonding pressure to the second area 32.

Once the pick-up tip 13 is fully retracted in the recess 16, the springs 14a-14b are compressed and the bond head 11 applies pressure to the body 12, which in turn applies bonding force to the first area 34, i.e. the housing, of the electronic device 30 and not the second area 32, i.e. the more sensitive barrel. Advantageously, the body 12 does not apply bonding force or significant pick-up force on the lens barrel 33 during the entire PNP operation.

Another aspect is directed to a method of positioning an electronic device 30 with a PNP apparatus 10 comprising a robotic arm 40, and a PNP tool head 45 carried by the robotic arm comprising a body 12 to apply bonding pressure to a first area 34 of an electronic device, and a pick-up tip 13. The pick-up tip 13 is to be movable between an extended position and a retracted position relative to the body 12 as the pick-up tip rests against a second area 32 of the electronic device 30. The pick-up tip may define at least one vacuum passageway 17 therethrough to couple the vacuum source 42 to the second area 32 of the electronic device 30. The method may comprise engaging the pick-up tip 13 adjacent the second area 32 of the electronic device 30, and subsequently engaging the body 12 adjacent the first area 34 of the electronic device.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A pick-and-place (PNP) apparatus comprising:
   a robotic arm; and
   a PNP tool head carried by said robotic arm comprising
      a body configured to directly apply bonding pressure to a first area of an electronic device, and
      a pick-up tip movable between an extended position and a retracted position relative to said body as said pick-up tip rests against a second area of the electronic device, said pick-up tip defining at least one vacuum passageway therethrough to couple a vacuum source to the second area of the electronic device, the electronic device comprising an image sensor housing defining the first area, and a lens barrel carried by the image sensor housing defining the second area, the first area extending from the second area to a periphery of the electronic device.

2. The PNP apparatus of claim 1 wherein said body has a tip receiving passageway therein; and wherein said pick-up tip is slidably received within the tip receiving passageway.

3. The PNP apparatus of claim 1 further comprising:
   a bond head coupled to said robotic arm; and
   at least one bias member coupled between said bond head and said body.

4. The PNP apparatus of claim 3 wherein said bond head has a recess therein configured to receive said pick-up tip when in the retracted position.

5. The PNP apparatus of claim 1 wherein said pick-up tip has a tubular shape with a distal open end defining the at least one vacuum passageway, and a vacuum source port coupled in fluid communication with the distal open end.

6. The PNP apparatus of claim 1 further comprising a controller coupled to said robotic arm.

7. The PNP apparatus of claim 1 wherein the electronic device has a rectangular shape with four upper corner portions defining the first area.

8. The PNP apparatus of claim 1 wherein the electronic device has a rectangular shape with an upper medial portion defining the second area; and wherein the at least one vacuum passageway comprises a single vacuum passageway aligned with the upper medial portion of the electronic device.

9. A pick-and-place (PNP) apparatus comprising:
   a robotic arm;
   a controller coupled to said robotic arm; and
   a PNP tool head carried by said robotic arm comprising
      a body configured to directly apply bonding pressure to a first area of an electronic device, and having a tip receiving passageway therein, and
      a pick-up tip slidably received within the tip receiving passageway and movable between an extended position and a retracted position relative to said body as said pick-up tip rests against a second area of the electronic device, said pick-up tip defining at least one vacuum passageway therethrough to couple a vacuum source to the second area of the electronic device, the electronic device comprising an image sensor housing defining the first area, and a lens barrel carried by the image sensor housing defining the second area, the first area extending from the second area to a periphery of the electronic device.

10. The PNP apparatus of claim 9 further comprising:
    a bond head coupled to said robotic arm; and
    at least one bias member coupled between said bond head and said body.

11. The PNP apparatus of claim 10 wherein said bond head has a recess therein configured to receive said pick-up tip when in the retracted position.

12. The PNP apparatus of claim 9 wherein said pick-up tip has a tubular shape with a distal open end defining the at least one vacuum passageway, and a vacuum source port coupled in fluid communication with the distal open end.

13. A pick-and-place (PNP) tool head comprising:
    a body configured to directly apply bonding pressure to a first area of an electronic device; and
    a pick-up tip movable between an extended position and a retracted position relative to said body as said pick-up tip rests against a second area of the electronic device, said pick-up tip defining at least one vacuum passageway therethrough to couple a vacuum source to the second area of the electronic device, the electronic device comprising an image sensor housing defining the first area, and a lens barrel carried by the image sensor housing defining the second area, the first area extending from the second area to a periphery of the electronic device.

14. The PNP tool head of claim 13 wherein said body has a tip receiving passageway therein; and wherein said pick-up tip is slidably received within the tip receiving passageway.

15. The PNP tool head of claim 13 further comprising:
    a bond head coupled to said robotic arm; and
    at least one bias member coupled between said bond head and said body.

16. The PNP tool head of claim 15 wherein said bond head has a recess therein configured to receive said pick-up tip when in the retracted position.

17. The PNP tool head of claim 13 wherein said pick-up tip has a tubular shape with a distal open end defining the at least one vacuum passageway, and a vacuum source port coupled in fluid communication with the distal open end.

* * * * *